(12) United States Patent
Yeh et al.

(10) Patent No.: US 8,248,817 B2
(45) Date of Patent: Aug. 21, 2012

(54) COMPUTER CHASSIS FOR MOUNTING MOTHERBOARD THEREIN

(75) Inventors: Chin-Wen Yeh, Taipei Hsien (TW); Zhen-Neng Lin, Shenzhen (CN)

(73) Assignees: Hong Fu Jin Precision Industry (ShenZhen) Co., Ltd., Shenzhen, Guandong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 385 days.

(21) Appl. No.: 12/508,169

(22) Filed: Jul. 23, 2009

(65) Prior Publication Data

US 2010/0296241 A1 Nov. 25, 2010

(30) Foreign Application Priority Data

May 22, 2009 (CN) .......................... 2009 1 0302540

(51) Int. Cl.
*H05K 7/12* (2006.01)
*H05K 7/00* (2006.01)
(52) U.S. Cl. ................ 361/801; 361/679.02; 361/679.6; 361/679.58; 361/752; 361/759
(58) Field of Classification Search .................. 361/755, 361/679.58, 679.02, 759, 730, 732, 801, 361/752, 753, 807, 802, 679.06, 796; 174/542, 174/535
See application file for complete search history.

(56) References Cited

U.S. PATENT DOCUMENTS

| 3,996,500 | A | * | 12/1976 | Coules | 361/748 |
| 4,422,222 | A | * | 12/1983 | Notoya | 24/614 |
| 4,766,652 | A | * | 8/1988 | Sugiura | 24/453 |
| 5,732,450 | A | * | 3/1998 | Quah et al. | 24/297 |
| 6,166,917 | A | * | 12/2000 | Anderson | 361/756 |
| 6,208,527 | B1 | * | 3/2001 | McMahon et al. | 361/801 |
| 6,418,028 | B2 | * | 7/2002 | Nariyama | 361/759 |
| 6,424,540 | B1 | * | 7/2002 | Chen et al. | 361/759 |
| 6,752,276 | B2 | * | 6/2004 | Rumney | 211/41.17 |
| 6,865,091 | B2 | * | 3/2005 | Hsu | 361/801 |
| 7,004,764 | B2 | * | 2/2006 | Boudreau et al. | 439/74 |
| 7,300,298 | B2 | * | 11/2007 | Kameda | 439/326 |
| 7,300,299 | B2 | * | 11/2007 | Wang | 439/326 |
| 7,342,809 | B2 | * | 3/2008 | Chen et al. | 361/801 |
| 7,430,129 | B1 | * | 9/2008 | Peng | 361/807 |
| 7,876,569 | B2 | * | 1/2011 | Xue | 361/759 |
| 2004/0125575 | A1 | * | 7/2004 | Chen et al. | 361/759 |

* cited by examiner

*Primary Examiner* — Angel R Estrada
*Assistant Examiner* — Dimary Lopez
(74) *Attorney, Agent, or Firm* — Altis Law Group, Inc.

(57) ABSTRACT

An apparatus includes a computer chassis and a motherboard. The computer chassis includes a bottom plate. A fastener is pivotally mounted on the bottom plate. The fastener defines a receiving slot. A plurality of convex projections is formed on the bottom plate. The motherboard is located on the plurality of convex projections with an edge of the motherboard clamped in the receiving slot.

15 Claims, 4 Drawing Sheets

COMPUTER CHASSIS FOR MOUNTING MOTHERBOARD THEREIN

This application is related to U.S. patent application Ser. No. 12/481,054, entitled "COMPUTER CHASSIS FOR MOUNTING MOTHERBOARD THEREIN." The present application and the co-pending application are assigned to the same assignee. The disclosures of the above-identified application are incorporated herein by reference.

BACKGROUND

1. Technical Field

The present embodiment relates to computer chassis, and particularly to a computer chassis that conveniently mounts a motherboard therein.

2. Description of Related Art

Conventionally, a motherboard is mounted to a computer chassis with fasteners, such as screws or bolts. However, when installing or removing the motherboard, a tool such as a screwdriver or a wrench is usually required, and tightening or removing the fasteners is laborious and time-consuming.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
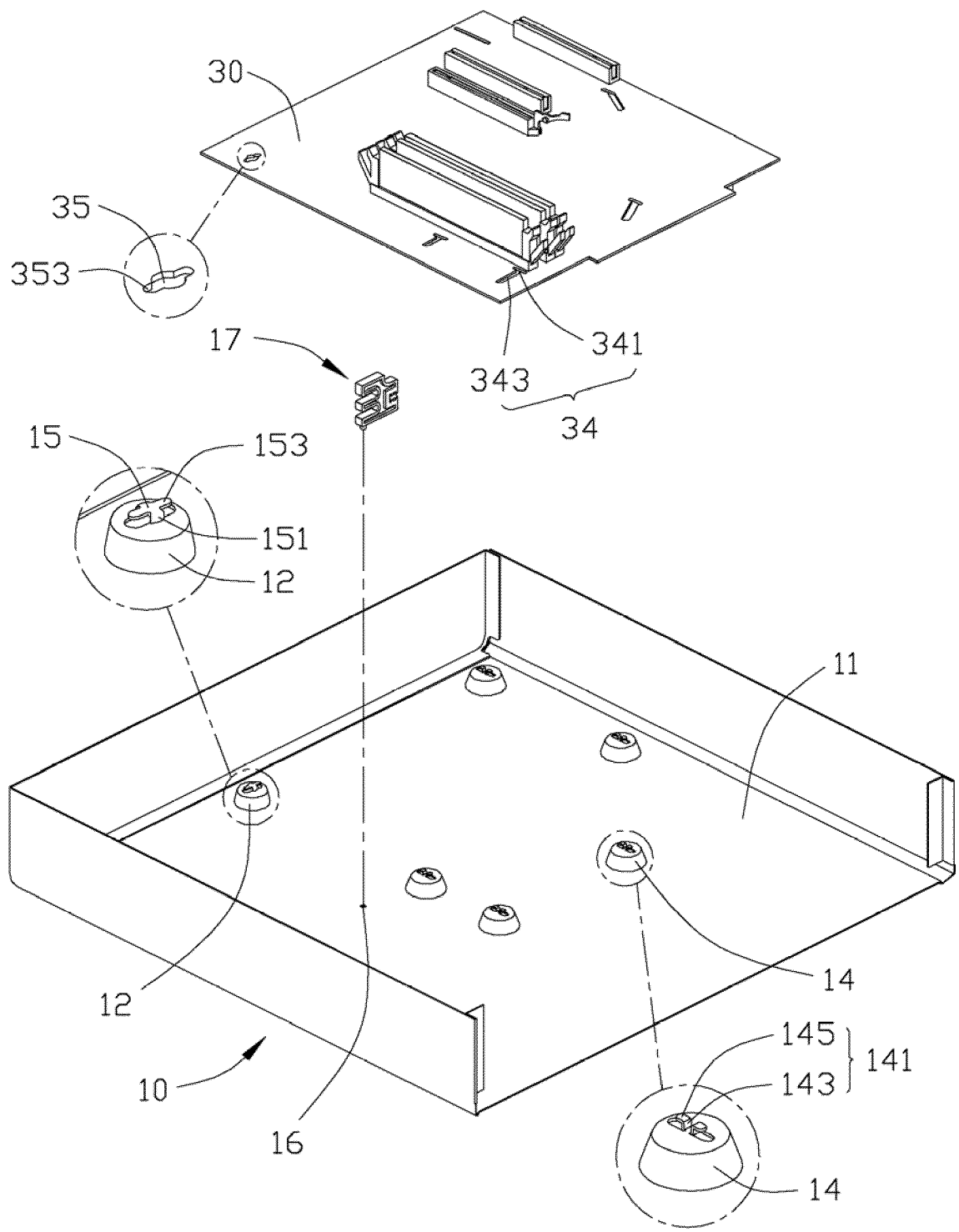
FIG. 1 is an exploded, isometric view of an embodiment of a computer chassis and a motherboard.

Referring to FIG. 1, a computer chassis 10 is used to mount a motherboard 30.

The chassis 10 includes a bottom plate 11. A pivot hole 16 is defined in the bottom plate 11. The bottom plate 11 has a first convex projection 12 and a plurality of second convex projections 14 protruded therefrom. A shaft 15 is formed on the first convex projection 12. The rotatable shaft 15 includes a pair of short legs 151 connected with the first convex projection 12, and a pair of long legs 153 located above the first convex projection 12. The pair of long legs 153 extends in opposite first directions parallel to the bottom plate 11.

The second convex projection 14 forms a pair of clasps 141. Each clasp 141 includes a vertical leg portion 143 standing on the second convex projection 14, and a horizontal foot portion 145 extending from the top end of the leg portion 143. The two foot portions 145 of the pair of clasps 141 extend away from each other and parallel to the bottom plate 11.

The motherboard 30 defines a pivot hole 35 corresponding to the shaft 15 of the chassis 10. A diameter of the pivot hole 35 is larger than a distance between the two short legs 151 of the shaft 15. A pair of shaft slots 353 are defined in the motherboard 30, and communicate with the pivot hole 35 for receiving the long legs 153 correspondingly. The motherboard 30 defines a plurality of clasp holes 34 corresponding to the plurality of clasps 141 of the chassis 10. Each clasp hole 34 includes a clasp slot 341 for correspondingly receiving the foot portions 145 of the clasp 141, and a curved groove 343 for receiving the leg portions 143 of the clasp 141. The curved groove 343 communicates with the clasp slot 341. A circular center of the curved groove 343 is positioned in the pivot hole 35.

Figure 2:
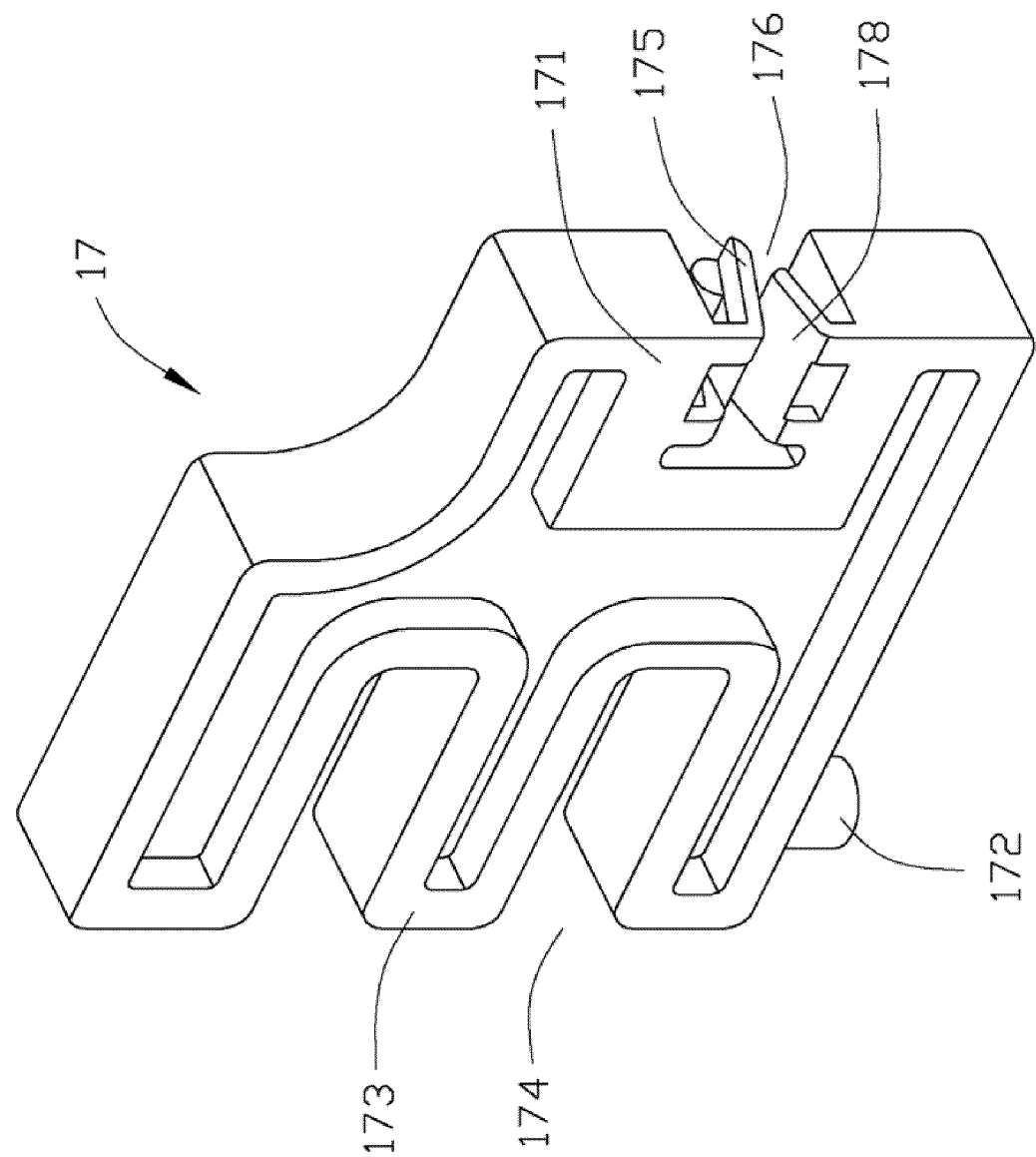
FIG. 2 is an isometric view of a fastener of FIG. 1.

Referring to FIGS. 1 and 2, a fastener 17 is adapted to be pivotally mounted in the pivot hole 16 of the chassis 10. The fastener 17 includes a main portion 171. One end of the main portion 171 defines a cutout 176, and the other end of the main portion 171 forms three separate poles 173. A receiving groove 174 is defined between two adjacent poles 173. A pivot pin 172 is formed on the bottommost pole 173 adapted to be mounted in the pivot hole 16 of the chassis 10. Two clip pieces 175 are formed in the cutout 176. The two clip pieces 175 are inclined toward each other to define a bugle shape receiving slot 178.

Figure 3:
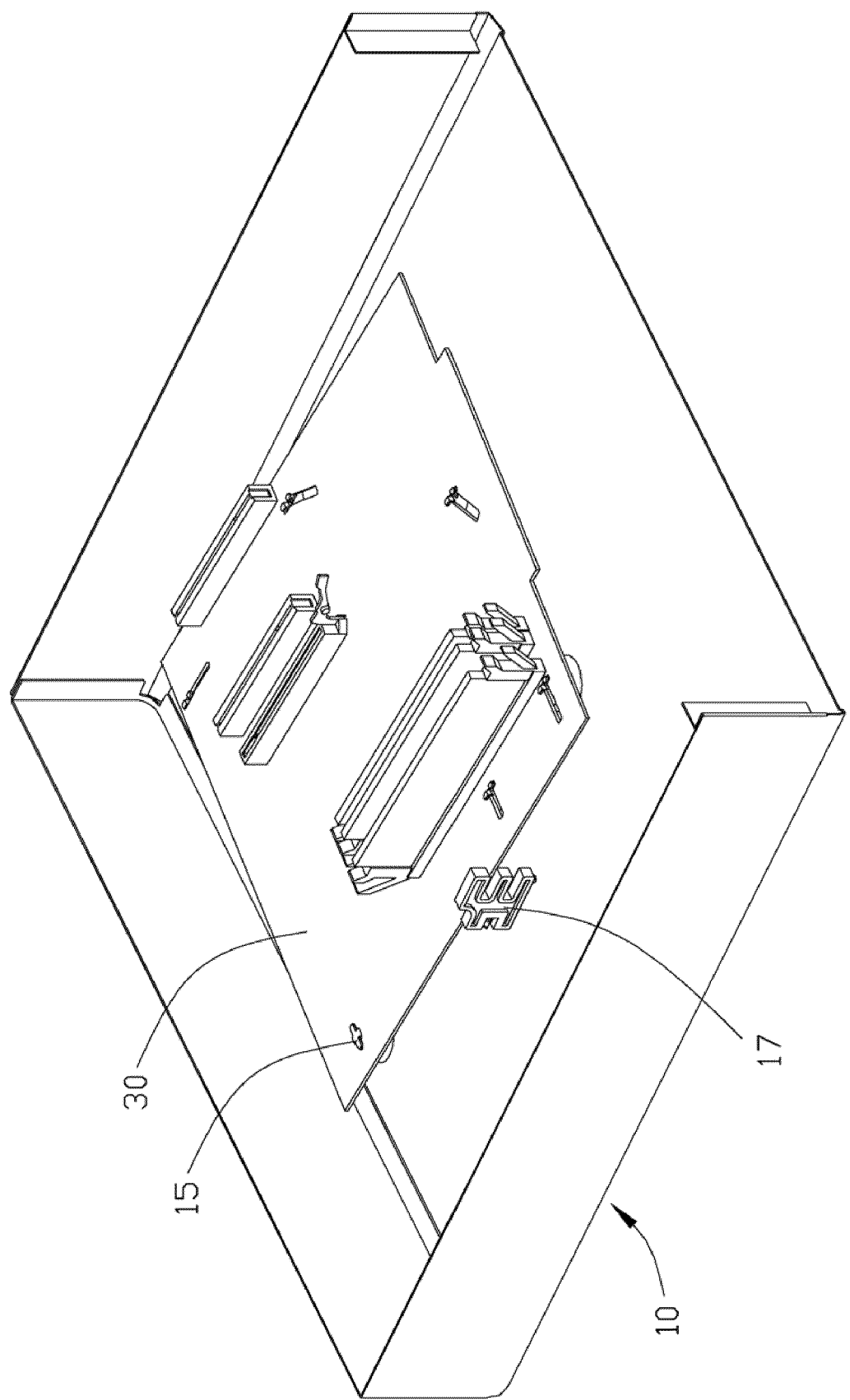
FIG. 3 is a partially-assembled view of the computer chassis and the motherboard of FIG. 1.
Figure 4:
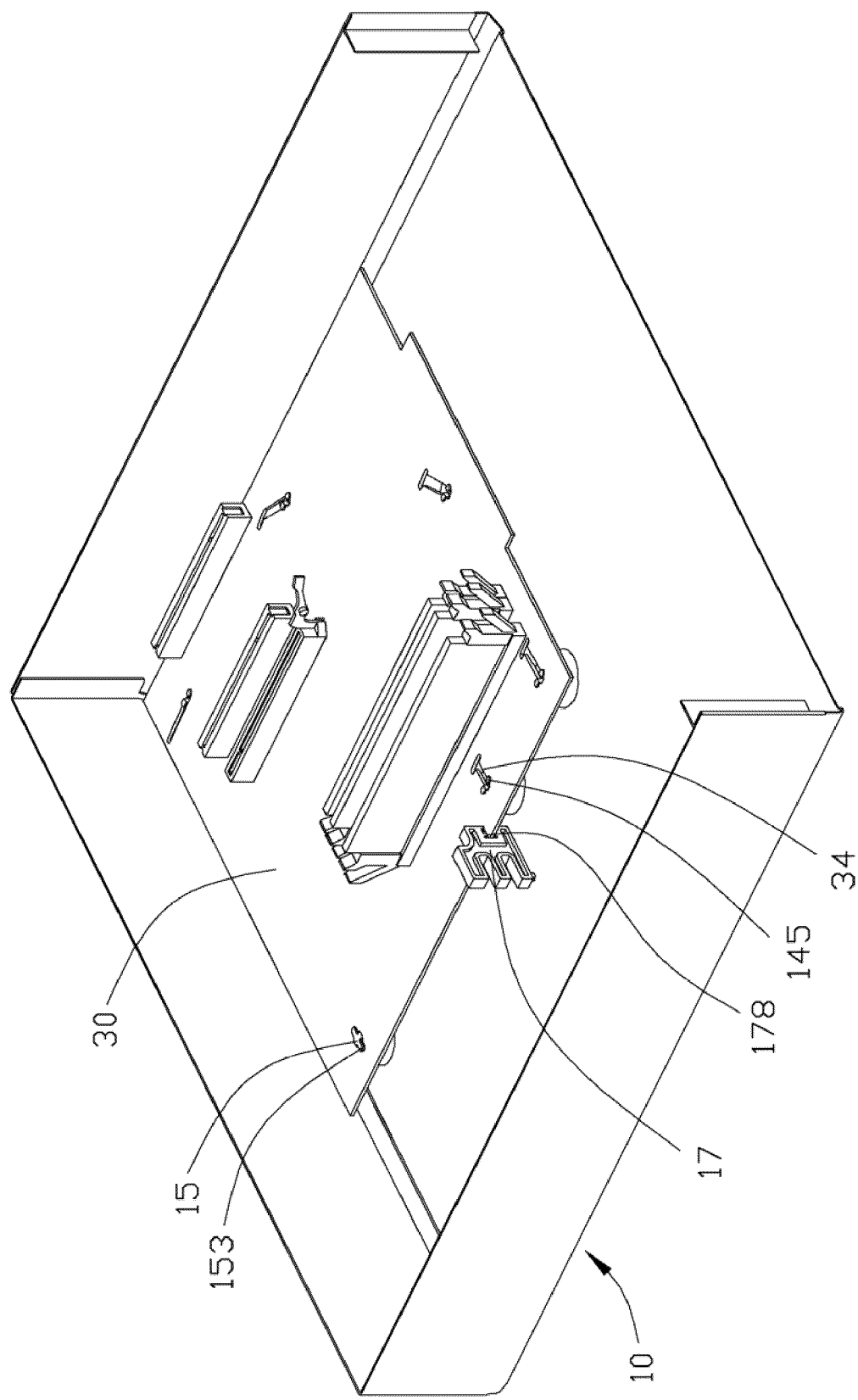
FIG. 4 is assembled view of the computer chassis and the motherboard of FIG.

Referring to FIGS. 3 and 4, in assembly of the motherboard 30 on the chassis 10, the pivot pin 172 of the fastener 17 is pivotally mounted in the pivot hole 16 of the chassis 10 firstly. Then, the pivot hole 35 of the motherboard 30 is aligned with the shaft 15 of the chassis 10, and each clasp slot 341 is aligned with corresponding clasp 141 of the chassis 10. The two long legs 153 of the shaft 15 extend through the shaft slots 353 of the motherboard 30 while the two short legs 151 remain in the pivot hole 35. Simultaneously, the foot portions 145 of each clasp 141 extend through the corresponding clasp slot 341 of the motherboard 30 to retain the leg portions 143 of the clasp 141 in the clasp slot 341. At this position, the leg portions 143 are in alignment with the curved groove 343. The motherboard 30 is supported on the convex projections 12 and 14.

The motherboard 30 then rotates about the shaft 15 on the convex projections 12 and 14. The leg portions 143 of the clasps 141 slide in the curved grooves 43 of the motherboard 30. Therefore, The long legs 153 of the shaft 15 becomes misaligned with the shaft slots 353, and the foot portions 145 of the clasp 141 becomes misaligned with the clasp slot 341 to restrict the motherboard 10 on the first and second convex projections 12, 14.

At last, the fastener 17 rotates about the pivot pin 172. An edge of the motherboard 30 slides in the receiving slot 178, and is clamped by the two clip pieces 175 to secure the motherboard 30 in the chassis 10.

In the above embodiment, the receiving grooves 174 and poles 173 of the fastener 17 can also be used to clamp different kinds of motherboards.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the present disclosure to the full extent indicated by the broad general meaning of the terms in which the appended claims are expressed.

What is claimed is:

1. An apparatus comprising:
    a computer chassis comprising a bottom plate, a fastener pivotally mounted on the bottom plate, the fastener defining a receiving slot, a plurality of convex projections formed on the bottom plate; and
    a motherboard located on the plurality of convex projections with an edge of the motherboard clamped in the receiving slot;

wherein each of the plurality of convex projections comprise a first convex projection, a shaft is formed on the first convex projection; the shaft comprises a short leg and a long leg, the shot leg connected with the first convex projection, the long leg extends in a first direction which is parallel to the bottom plate; the motherboard defines a pivot hole and a shaft slot communicating with the pivot hole; the long leg of the shaft extends through the shaft slot to retain the short leg in the pivot hole, the motherboard rotates about the short leg to have the edge of the motherboard clamped in the receiving slot, and the long leg of the shaft is misaligned with the shaft slot to restrict the motherboard on the first convex projection.

2. The apparatus of claim 1, wherein the fastener defines a cutout, two clip pieces are formed in the cutout, and are inclined toward each other to form the receiving slot therebetween.

3. The apparatus of claim 2, wherein the receiving slot is bugle shape.

4. The apparatus of claim 1, wherein the bottom plate defines a pivot hole, the fastener comprises a pivot pin pivotally mounted in the pivot hole.

5. The apparatus of claim 1, wherein the plurality of convex projections comprise a second convex projection, a clasp is formed on the second convex projection, the clasp comprises a leg portion connected with the second convex projection, and a foot portion formed on a free end of the leg portion, the foot portion is parallel to the bottom plate; the motherboard defines a clasp hole which has a clasp slot and a curved groove communicating with second slot; the foot portion of the clasp extends through the clasp slot, the leg portion slides in the curved groove with the foot portion of the clasp is misaligned with the clasp slot to restrict the motherboard on the second convex projection when the edge of the motherboard is clamped in the receiving slot.

6. The apparatus of claim 5, wherein a circular center of the curved groove is positioned at the pivot hole.

7. The apparatus of claim 1, wherein the fastener comprises a main portion, one end of the main portion defines the receiving slot, and the other end of the main portion forms a plurality of separated poles, a receiving groove is defined between two adjacent poles capable of clamping other motherboards therein.

8. An apparatus comprising:
a motherboard defining a pivot hole and a clasp hole, the clasp hole comprising a clasp slot and a curved groove communicating with clasp slot; and
a computer chassis comprising:
a bottom plate, a fastener pivotally mounted on the bottom plate, the fastener defining a receiving slot;
a first convex projection formed on the bottom plate, a shaft formed on the first convex projection; and
a second convex projection formed on the bottom plate, a clasp formed on the second convex projection, the clasp comprising a leg portion connected with the second convex projection, and a foot portion formed on a free end of the leg portion;
wherein the motherboard is rotatable between a first and a second position, in the first position the motherboard is located on the first and second convex projections, the shaft of the first convex projection is located in the pivot hole, the foot portion of the clasp extends through the clasp slot with the leg portion remained in the clasp slot and aligned with the curved groove; in the second position the leg portion of the clasp is located in the curved groove, the foot portion of the clasp is misaligned with the clasp slot to restrict the motherboard on the second convex projection, and an edge of the motherboard is clamped in the receiving slot.

9. The apparatus of claim 8, wherein the shaft comprises a short leg and a long leg, the short leg is connected with the first convex projection, a shaft slot is defined in the motherboard to communicate with the pivot hole, the long leg of the shaft extends through the shaft slot to retain the short leg in the pivot hole in the first position, the long leg of the shaft is misaligned with the shaft slot to restrict the motherboard on the first convex projection in the second position.

10. The apparatus of claim 9, wherein the long leg and the foot portion are parallel to the bottom plate.

11. The apparatus of claim 8, wherein a circular center of the curved groove is positioned at the pivot hole.

12. The apparatus of claim 8, wherein the fastener defines a cutout, two clip pieces are formed in the cutout and are inclined toward each other to form the receiving slot therebetween.

13. The apparatus of claim 8, wherein the fastener comprises a main portion, one end of the main portion defines the receiving slot, and the other end of the main portion forms a plurality of separated poles, a receiving groove is defined between two adjacent poles capable of clamping other motherboards therein.

14. A computer chassis for mounting a motherboard defining a pivot hole and a clasp hole, the clasp hole comprising a clasp slot and a curved groove communicating with the clasp slot, the computer chassis comprising:
a bottom plate, a fastener pivotally mounted on the bottom plate, the fastener defining a receiving slot;
a first convex projection formed on the bottom plate, a shaft formed on the first convex projection; and
a second convex projection formed on the bottom plate, a clasp formed on the second convex projection, the clasp comprising a leg portion connected with the second convex projection, and a foot portion formed on a free end of the leg portion;
wherein the motherboard is rotatable between a first and a second position, in the first position the motherboard is located on the first and second convex projections, the shaft of the first convex projection is located in the pivot hole, the foot portion of the clasp extends through the clasp slot with the leg portion remained in the clasp slot and aligned with the curved groove; in the second position the leg portion of the clasp is located in the curved groove, the foot portion of the clasp is misaligned with the clasp slot to restrict the motherboard on the second convex projection, and an edge of the motherboard is clamped in the receiving slot.

15. The computer chassis of claim 14, wherein the shaft comprises a short leg and a long leg, the short leg is connected with the first convex projection, a shaft slot is defined in the motherboard to communicate with the pivot hole, the long leg of the shaft extends through the shaft slot to retain the short leg in the pivot hole in the first position, the long leg of the shaft is misaligned with the shaft slot to restrict the motherboard on the first convex projection in the second position.

* * * * *